(12) United States Patent
Azuma et al.

(10) Patent No.: US 8,609,014 B2
(45) Date of Patent: Dec. 17, 2013

(54) TEMPLATE MANUFACTURING METHOD, SEMICONDUCTOR DEVICE MANUFACTURING METHOD AND TEMPLATE

(75) Inventors: Tsukasa Azuma, Kawasaki (JP); Tatsuhiko Higashiki, Fujisawa (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 13/150,961

(22) Filed: Jun. 1, 2011

(65) Prior Publication Data

US 2012/0009799 A1    Jan. 12, 2012

(30) Foreign Application Priority Data

Jul. 7, 2010   (JP) .................................. 2010-154849

(51) Int. Cl.
*B29C 67/20*   (2006.01)
(52) U.S. Cl.
USPC ........... 264/413; 264/414; 264/423; 264/424; 264/430; 264/483; 264/488; 264/219; 264/220; 425/174; 425/174.4
(58) Field of Classification Search
USPC ......... 264/430, 483, 488, 219, 220, 413, 414, 264/423, 424; 425/174, 174.4
See application file for complete search history.

(56) References Cited

U.S. PATENT DOCUMENTS

| | | | | |
|---|---|---|---|---|
| 5,772,905 | A * | 6/1998 | Chou | .............................. 216/44 |
| 2006/0286490 | A1 * | 12/2006 | Sandhu et al. | ................ 430/394 |
| 2009/0140458 | A1 * | 6/2009 | Xu et al. | ........................ 264/293 |
| 2010/0104852 | A1 * | 4/2010 | Fletcher et al. | ............ 428/315.5 |
| 2010/0294146 | A1 * | 11/2010 | Fragala et al. | ................... 101/28 |

FOREIGN PATENT DOCUMENTS

| | | |
|---|---|---|
| JP | 63 197611 | 8/1988 |
| JP | 2006 278879 | 10/2006 |
| JP | 2007-536107 | 12/2007 |
| JP | 2008-78550 | 4/2008 |
| JP | 2008-246944 | 10/2008 |
| JP | 2009-83125 | 4/2009 |
| JP | 2009 096191 | 7/2009 |

OTHER PUBLICATIONS

Notice of Reason for Rejection issued in corresponding Japanese Patent Application No. 2010-154849 mailed Jul. 23, 2013, 6 pages.

* cited by examiner

*Primary Examiner* — Timothy Kennedy
(74) *Attorney, Agent, or Firm* — Finnegan, Henderson, Farabow, Garrett & Dunner, L.L.P.

(57) ABSTRACT

According to one embodiment, a template manufacturing method is a method for manufacturing a template for use in an imprint processing in which a pattern having irregularities are formed on a principal surface, and the pattern is brought into contact with a resist member formed on a substrate to be processed, to transfer the pattern to the resist member, the method including implanting charged particles at least into the bottoms of concave portions of the template.

9 Claims, 6 Drawing Sheets

TEMPLATE MANUFACTURING METHOD, SEMICONDUCTOR DEVICE MANUFACTURING METHOD AND TEMPLATE

CROSS-REFERENCE TO RELATED APPLICATION

This application is based upon and claims the benefit of priority from prior Japanese Patent Application No. 2010-154849, filed on Jul. 7, 2010, the entire contents of which are incorporated herein by reference.

FIELD

Embodiments of the present invention relate to a template manufacturing method and a semiconductor device manufacturing method.

BACKGROUND

As a conventional technique, a template formed of a material having high gas permeability is known.

Since a template has high gas permeability when imprint processing is performed, its deformation due to absorption of a gas can be suppressed. However, a defect of a transfer pattern occurs chiefly because a resist member insufficiently fills up due to a gas accumulated between a pattern concave section of the template and the resist member, and it has been difficult to overcome the problem of the insufficient filling resist member just by forming the template of the material having high gas permeability.

DETAILED DESCRIPTION

In one embodiment, a template manufacturing method is a method for manufacturing a template for use in an imprint processing in which a pattern having irregularities are formed on a principal surface, and the pattern is brought into contact with a resist member formed on a substrate to be processed, to transfer the pattern to the resist member, the method including implanting charged particles at least into the bottoms of concave portions of the template.

First Embodiment

Configuration of Template

Figure 1:
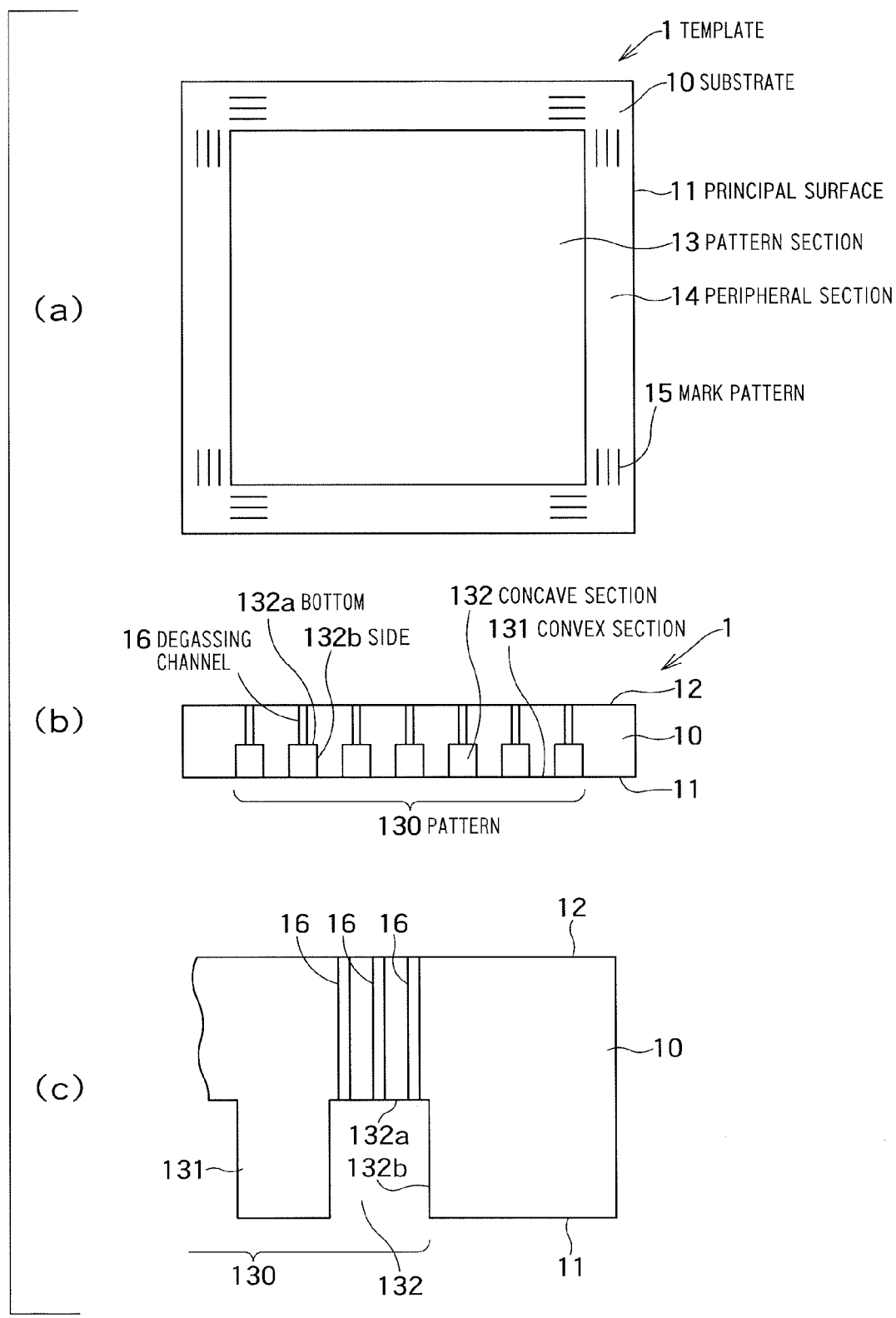
FIG. 1(a) is a schematic view of a template according to a first embodiment, seen from a principal surface.
FIG. 1(b) is a chief-part sectional view of the template.
FIG. 1(c) is an expanded view obtained by expanding part of a pattern of the template.

FIG. 1(a) is a schematic view of a template according to a first embodiment, seen from the principal surface, FIG. 1(b) is a chief-part sectional view of the template, and FIG. 1(c) is an expanded view obtained by expanding part of a pattern of the template. It is to be noted that in FIG. 1(a), illustration of the pattern formed in a pattern section 13 is omitted. Further, although a pattern 130 formed in the pattern section 13 is hereinafter described for example as a line-and-space pattern in which lines and spaces are arrayed at regular intervals, the shape of the pattern 130 is not restricted to this.

A template 1 is, for example, used for nanoimprint lithography. For example, as shown in FIG. 1(a), the pattern section 13 is formed at the center of a principal surface 11 of a substrate 10. Further, in the template 1, for example, a plurality of mark patterns 15 are formed on a peripheral section 14 as a periphery of the pattern section 13.

The substrate 10 is, for example, a substrate having transparency with respect to energy beams that cure a later-mentioned resist member. For the substrate 10, for example, silicon (Si), silicon oxide ($SiO_2$), diamond-like carbon (DLC), or the like is used. The substrate 10 in the present embodiment is formed of silicon oxide ($SiO_2$). The substrate 10 is, for example, formed in a shape of a square with one side of 300 mm. Further, the substrate 10 has a thickness of 100 μm.

The pattern section 13 is formed, for example, by graving the principal surface 11 of the template 1, as shown in FIG. 1(b). It is to be noted that the pattern section 13 may be formed in a mesa structure provided in the principal surface 11.

In this pattern section 13, for example, the pattern 130 is formed. In the pattern 130, for example, convex sections 131 and concave sections 132 are alternatively formed. The pattern 130 is, for example, a line-and-space pattern where widths of the convex section 131 and the concave section 132 are the same, and an interval between the convex sections 131 and an interval between the concave sections 132 are the same.

The concave section 132, for example, has a bottom 132a and sides 132b. On the bottoms 132a, for example, a plurality of degassing channels 16 are formed.

The degassing channel 16 is, for example, a through hole penetrating the template 1 from the principal surface 11 to a back surface 12. The degassing channels 16 are further formed in a plurality of number along the concave section 132. It is to be noted that the degassing channel 16 is not restricted to the through hole, but may be a hole open to the concave section 132 side.

Hereinafter, a template manufacturing method according to the present embodiment will be described.

(Template Manufacturing Method)

FIGS. 2A to 2E are chief-part sectional views showing a template manufacturing process according to the first embodiment.

Figure 2:
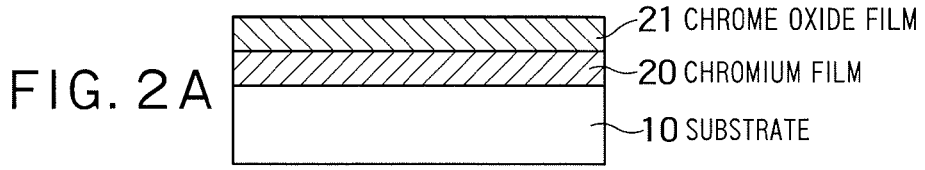
FIGS. 2A to 2E are chief-part sectional views showing a template manufacturing process according to the first embodiment.
Figure 2:
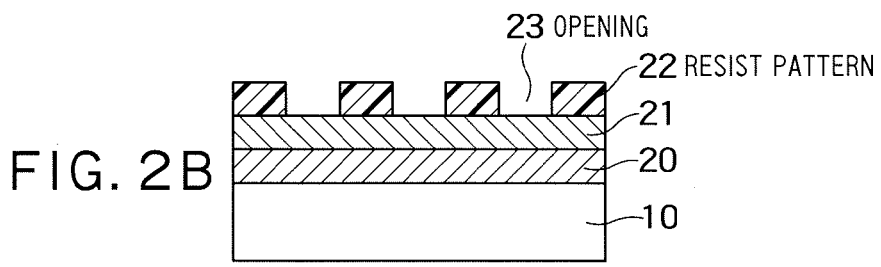
Figure 2:
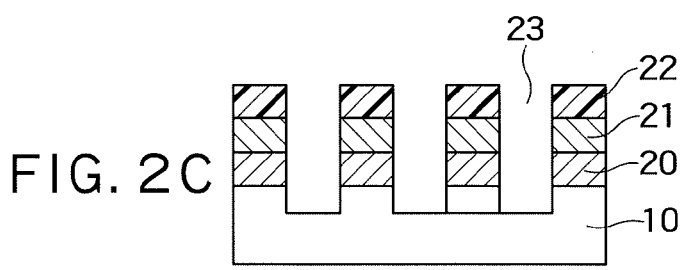
Figure 2:
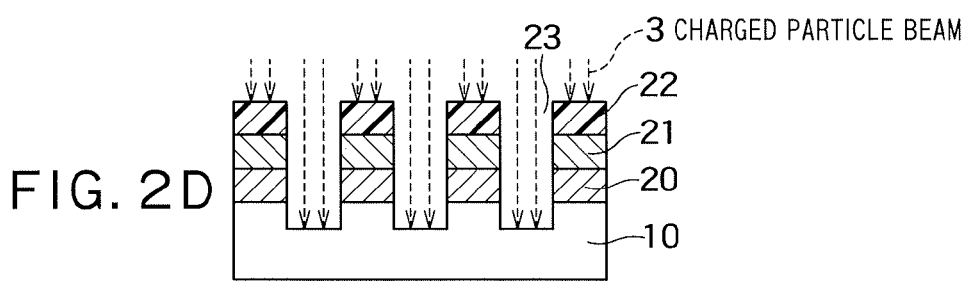
Figure 2:
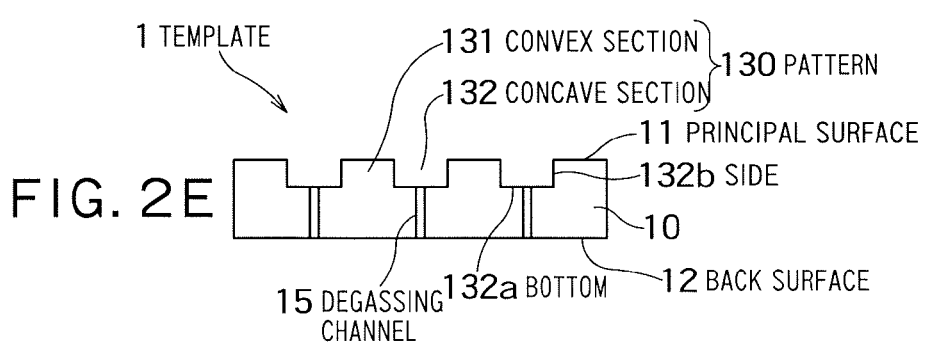

First, as shown in FIG. 2A, a chromium film 20 and a chrome oxide film 21 are sequentially formed on the substrate 10.

Specifically, first, the chromium film 20 is formed on the substrate 10 by vacuum vapor deposition or the like. This chromium film 20, for example, has a thickness of 70 nm. Subsequently, the chrome oxide film 21 is formed on the chromium film 20 by vacuum vapor deposition or the like. The chrome oxide film 21, for example, has a thickness of 30 nm.

Next, as shown in FIG. 2B, a resist pattern 22 is formed on the chrome oxide film 21 by photolithography or the like. This resist pattern 22 has a plurality of openings 23 as shown in FIG. 2B.

Next, as shown in FIG. 2C, the substrate 10 is etched with the resist pattern 22 used as a mask by reactive ion etching (RIE) or the like. Specifically, the chrome oxide film 21, exposed at the plurality of openings 23 of the resist pattern 22, and the chromium film 20 are sequentially etched. Subsequently, the substrate 10 exposed to the plurality of openings 23 is etched with a desired depth.

Next, as shown in FIG. 2D, the charged particle beams 3 are implanted into the substrate 10. This charged particle beam 3 is, for example, made up of at least one of $e^-$, H, He, Li, Be, B, C, N, O, F, Ne, Na, Mg, Al, Si, P, S, Cl, Ar, K, Ca, Ti, Cr, Fe, Co, Ni, Cu, Zn, Ga, Ge, As, Br, Kr, Mo, I and Xe. It is to be noted that the charged particle beams 3 are, for example, at least one kind of charged particles being translated.

At this point, for the charged particle beam 3, an inactive gas such as He, Ne, Ar, Kr or Xe is preferably used. Further, for example, as described later, imprint processing is performed in a He gas atmosphere, and hence the charged particle beam 3 preferably has an atomic weight larger than He. Moreover, for example in the case of the substrate 10 being a glass substrate such as silicon oxide, impurities contained in the glass substrate, such as B and Al, are preferably used. Using the impurities contained in the glass substrate as the charged particle beams 3 can prevent reduction in transmittance due to implantation of the charged particle beams 3, and further leading to an increased strength of the template 1.

Moreover, when the charged particle beams 3 are, for example, halogen-based particles containing F, Br and the like, the principal surface 11 of the template 1 is reformed by the implantation, and water repellency of the principal surface 11 side is improved. An improvement in water repellency of the template 1 leads to an improvement in mold-releasing properties between the template 1 and the resist member. The halogen-based charged particle beams 3 may, for example, be shallowly implanted for the purpose of reforming the principal surface 11 after the degassing channels 16 have been formed by other charged particle beams 3.

This implantation of the charged particle beams 3 is, for example, performed from a direction of a normal line of the principal surface 11 of the substrate 10 with the resist pattern 22 used as a mask, and the charged particle beams 3 are implanted into the substrate 10 exposed to the plurality of openings 23 of the resist pattern 22. It should be noted that the implantation of the charged particle beam 3 may, for example, be performed after removal of the resist pattern 22, the chrome oxide film 21 and the chromium film 20. The degassing channels 16 are formed on the bottoms 132a of the plurality of concave sections 132 of the template 1. Forming the degassing channel 16 in this concave section 132 leads to an improvement in mold-releasing properties between the cured resist member and the template 1 in the imprint processing.

Figure 3:
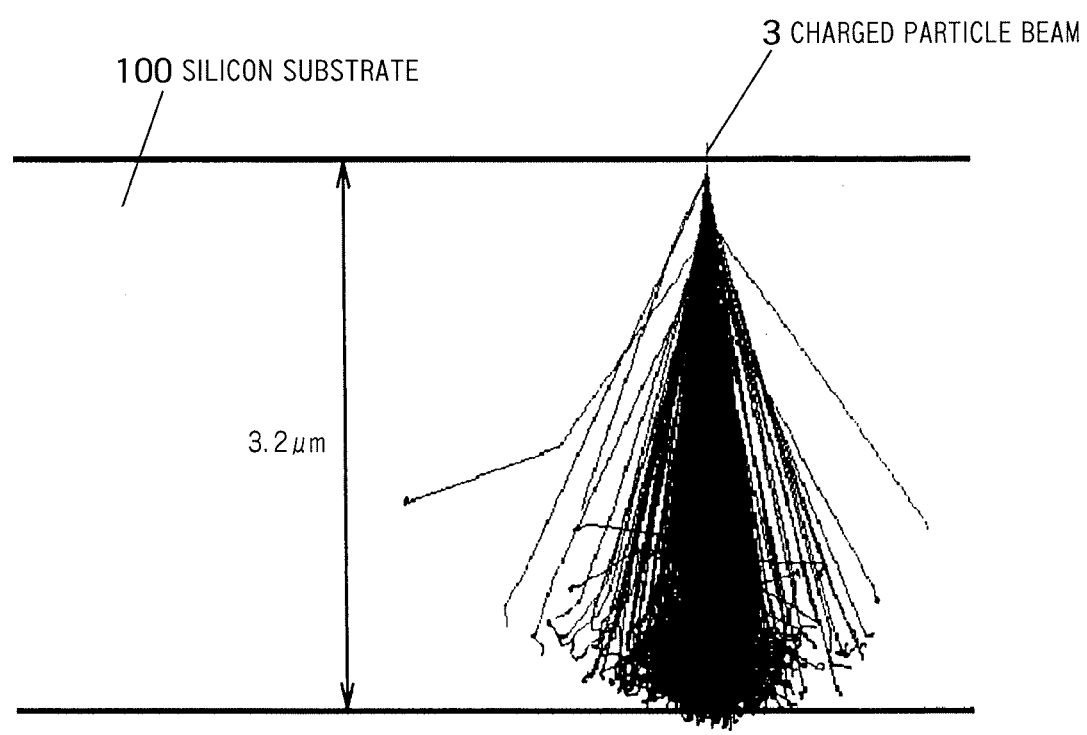
FIG. 3 is a view showing a simulation result of charged particle beams implanted into a silicon substrate according to the first embodiment.

FIG. 3 is a view showing a simulation result of charged particle beams implanted into a silicon substrate according to the first embodiment. FIG. 3 shows a result of Monte Carlo simulation of implanting $H^+$ as the charged particle beams 3 into a silicon substrate 100 with accelerated energy of 100 keV. According to this simulation, a depth reached by the implanted charged particle beam 3 was, for example, about 3.2 μm as shown in FIG. 3.

From this simulation result, it can be seen that, for example, the depth reached by the implanted charged particle beam 3 is about 32 μm when the accelerated energy is 1 MeV, and the depth is about 100 μm when the accelerated energy is 3 MeV. Further, it was found from another experiment that the reached depth is about 100 μm when the charged particle beam 3 is $^4$He and the accelerated energy is 8 MeV.

It is found from the above results that the number of degassing channels 16 and the state of penetration thereof can be controlled by adjusting the accelerated energy in accordance with the thickness of the substrate 10, the kind of the charged particle beam 3, and the like. At this point, the state of penetration is, for example, penetration or non-penetration of the hole. That is, as described later, since the degassing channel 16 is provided for discharging a gas accumulated between the concave section 132 of the template 1 and the resist member, the degassing channel 16 may not just discharge the gas to the outside of the template 1, but may just absorb the gas. Therefore, for example, the degassing channel 16 may not be restricted to the through hole, but may be a non-through hole.

It is to be noted that, depending upon the thickness of the substrate 10, the charged particle beams 3 may not only be implanted from the principal surface 11 side, but may be implanted from the back surface 12 side. Implanting the charged particle beams 3 also from the back surface 12 side can form the degassing channel 16 penetrating the template 1 with low accelerated energy.

Next, as shown in FIG. 2E, the chromium film 20, the chrome oxide film 21 and the resist pattern 22 are removed, to obtain the template 1. It is to be noted that the degassing channel 16 may be formed by implanting the charged particle beam 3 into the template 1 after formation of the pattern 130. This implantation leads to formation of the degassing channel 16 in the convex section 131 of the template 1. The degassing channel 16 formed in the convex section 131, for example, improves the mold-releasing properties with the resist member, and improves the speed at which the resist member fills up.

Hereinafter, a semiconductor manufacturing method using the template according to the present embodiment, and semiconductor device manufacturing methods will be described.

(Semiconductor Device Manufacturing Method)

FIGS. 4A to 4F are chief-part sectional views showing a semiconductor device manufacturing process using the template according to the first embodiment. The semiconductor device manufacturing process shown below shall be performed in an inactive gas atmosphere in order to improve the speed at which the resist member fills up. A He gas 6 is used as the inactive gas in the present embodiment.

Figure 4:
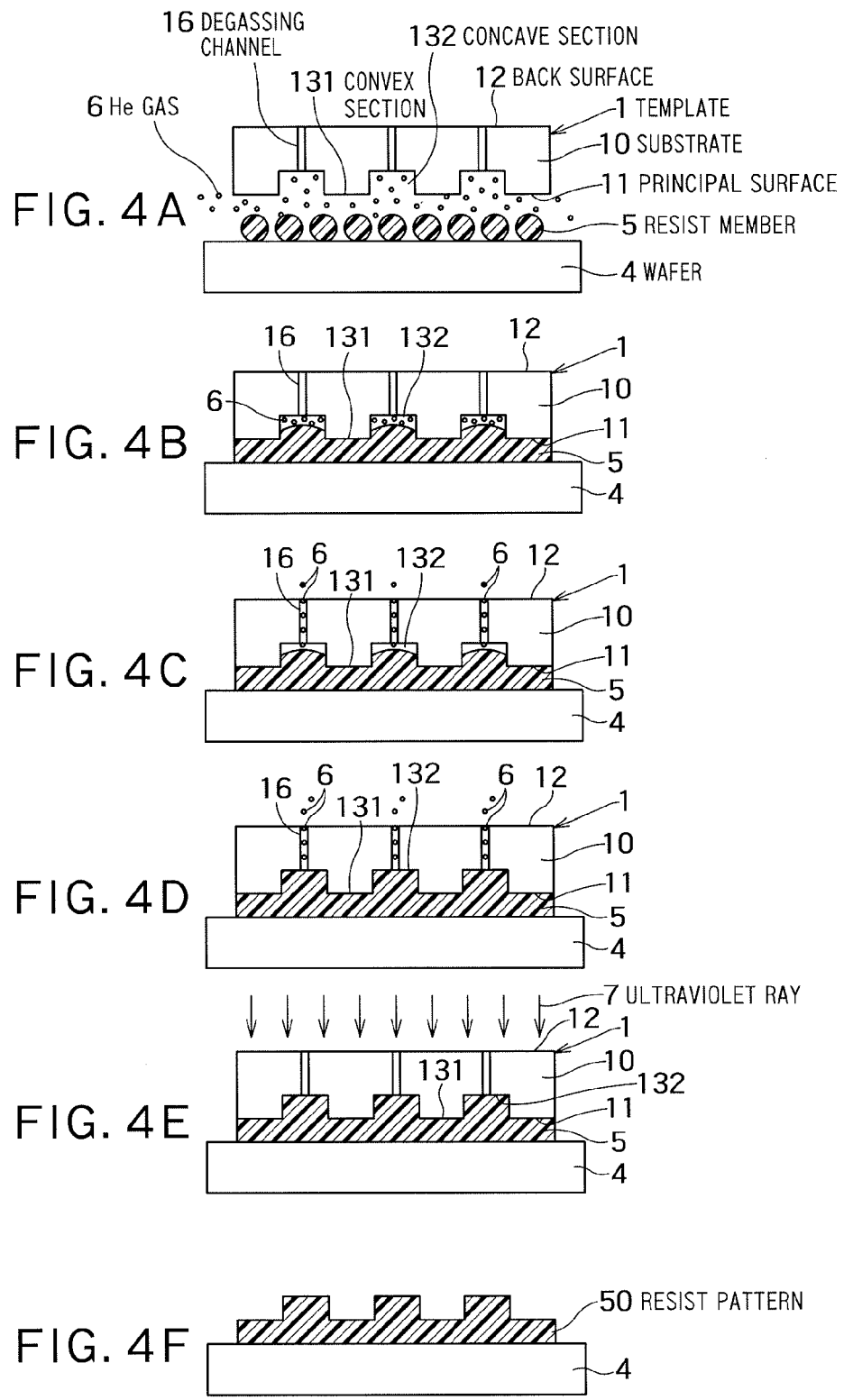
FIGS. 4A to 4F are chief-part sectional views showing a semiconductor device manufacturing process using the template according to the first embodiment.

First, as shown in FIG. 4A, a resist member 5 is applied on a wafer 4 as a substrate to be processed. This resist member 5, for example, has photo-curing properties. Further, the resist member 5 in the present embodiment is, for example, an ultraviolet curable resin such as silicon. The resist member 5 may be applied by a method of dropping liquid droplets by ink-jetting, or a method of rotational application by sputtering. It is to be noted that this resist member 5 shall, for example, contain a mold-releasing agent that improves the mold-releasing properties between the template 1 and the cured resist member 5.

Next, as shown in FIG. 4B, the template 1 is brought into contact with the resist member 5. At the time of this contact, a clear dry air (CDA) or the like is blown on the template 1 from the back surface 12 side, and the template 1 thereby transforms, to be brought into contact with the resist member 5 from the vicinity of the center. After the template 1 and the resist member 5 have been brought into contact, the He gas 6 remains between the concave section 132 and the resist member 5, as shown in FIG. 4B.

Next, as shown in FIG. 4C, the template 1 and the resist member 5 are further brought into contact. Due to an increase in pressure inside the concave section 132, the He gas 6 remaining between the concave section 132 and the resist member 5 is discharged from the degassing channel 16 to the outside of the template 1, as shown in FIG. 4C.

Next, as shown in FIG. 4D, the template 1 is brought closer to the wafer 4 until a distance between the template 1 and the wafer 4 becomes a predetermined distance, to fill the concave section 132 with the resist member 5.

At this point, the He gas 6 remaining between the concave section 132 and the resist member 5 causes a failure of filling with the resist member 5, and a defect of a transfer pattern to be transferred to the resist member 5. However, as shown in FIG. 4D, with the degassing channels 16 formed in the template 1, the He gas 6 is discharged from the degassing channels 16, and thereby, the concave section 132 is filled with the resist member 5 without a space.

Next, as shown in FIG. 4E, the resist member 5 is irradiated with ultraviolet rays 7 from the back surface 12 side of the template 1, so as to be cured.

Next, as shown in FIG. 4F, after the resist member 5 has been cured, the template 1 and the wafer 4 are separated, and a resist pattern 50 is formed as a transfer pattern on the wafer 4. Subsequently, through a known process, a desired semiconductor device is obtained.

Next, after the imprint processing using the template 1 has been performed a predetermined number of times, the template 1 is annealed for discharging the He gas 6 accumulated inside the template 1.

Effect of First Embodiment

According to the first embodiment, with the template 1 having the degassing channel 16, the He gas 6 between the concave section 132 and the resist member 5 can be discharged, and it is thereby possible to prevent the defect of the transfer pattern caused by the failure of filling with the resist member 5.

Further, according to the first embodiment, the He gas 6 accumulated inside the template 1 can be discharged by annealing the template 1 which has been used the predetermined number of times, and it is thereby possible to prevent a decrease in filling speed, and the like, so as to improve throughput in the semiconductor device manufacturing process.

Second Embodiment

The second embodiment is different from the first embodiment in that a relative angle between the proceeding direction of the charged particle beam 3 and the normal line of the principal surface 11 of the template 1 is θ, where θ is an angle not zero. It should be noted that in each of embodiments below, each of portions having similar configurations and functions to in the present embodiment shall be provided with the same numeral, and a description thereof will not be repeated.

Figure 5:
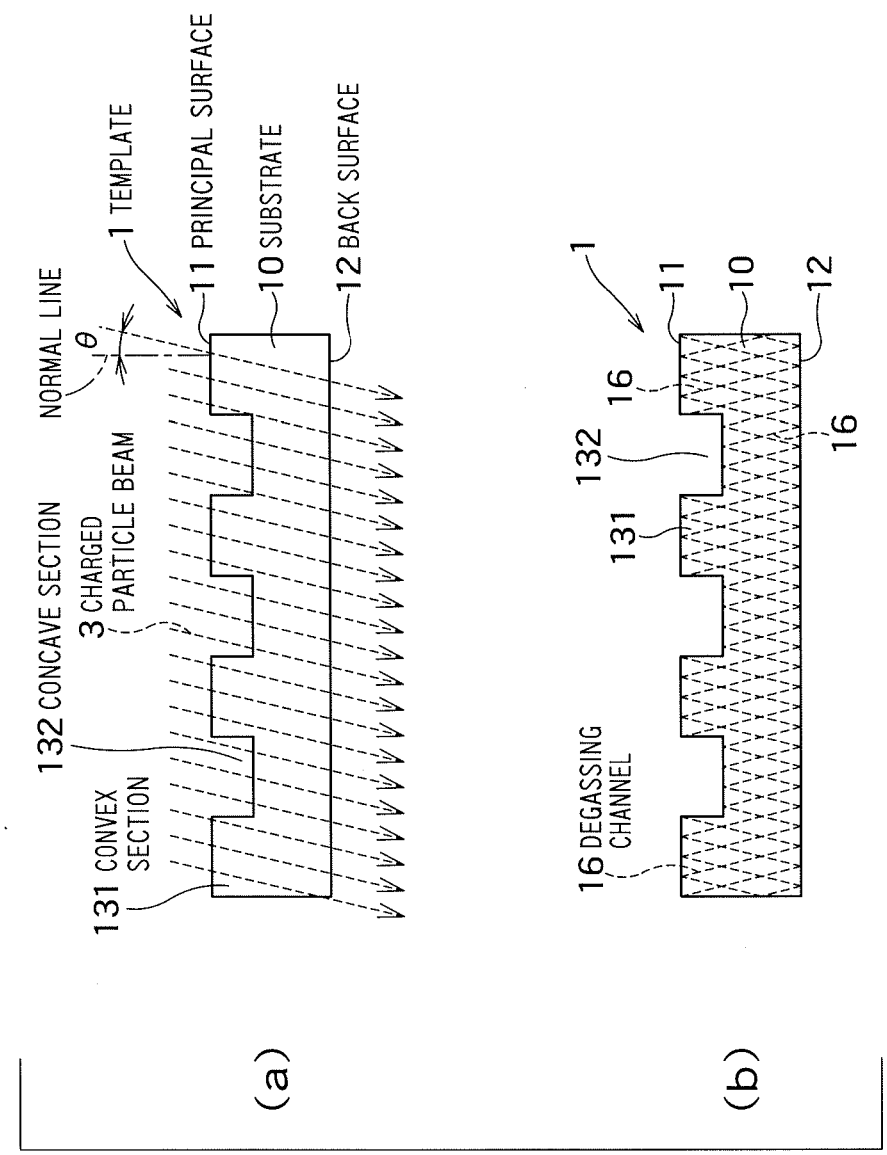
FIG. 5(a) is a schematic view showing a step of implanting charged particle beams into a template according to a second embodiment.
FIG. 5(b) is a schematic view of degassing channels formed in the template.

FIG. 5(a) is a schematic view showing a step of implanting charged particle beams into the template according to a second embodiment, and FIG. 5(b) is a schematic view of degassing channels formed in the template. Dotted lines shown in FIG. 5(b) indicate the degassing channels 16.

(Template Manufacturing Method)

First, the template 1, formed with the plurality of the convex sections 131 and concave sections 132 on the principal surface 11 side, is prepared.

Next, as shown in FIG. 5(a), the charged particle beams 3 are implanted into the principal surface 11 of the template 1 from the direction at a relative angle being θ with respect to the normal line of the principal surface 11. Subsequently, the charged particle beams 3 are implanted into the principal surface 11 of the template 1 from a different direction from the direction of the previous implantation. In the present embodiment, for example, this implantation is performed from a symmetrical direction to the relative angle of θ with the normal line taken as a symmetrical axis. It should be noted that the implantation of the charged particle beams 3 may be performed not less than three times while the angle is changed. Further, the charged particle beams 3 may be implanted with the template 1 inclined so as to have the relative angle of θ.

As shown in FIG. 5(b), the plurality of degassing channels 16 are formed by implantation of the charged particle beams 3, to obtain the template 1.

Effect of Second Embodiment

According to the second embodiment, with the charged particle beams 3 implanted into the template 1 at changed angles, it is possible to form a large number of degassing channels 16 in the template 1 as compared with the case of the implantation from one direction with the same density and accelerated energy. Specifically, the degassing channels 16 are also formed on the side surfaces of the convex sections 131. Since the large number of degassing channels 16 have been formed in the template 1, the time taken to discharge the He gas 6 becomes shorter, to improve the speed at which the resist member 5 fills up. Further, since the large number of degassing channels 16 have been formed in the convex sections 131 and the concave sections 132 in the template 1, the surface of the principal surface 11 of the template 1 is reformed, to have excellent mold-releasing properties with the resist member 5.

Third Embodiment

The third embodiment is different from each of the above embodiments in that the degassing channels are formed by plasma-doping.

FIG. 6(a) is a schematic view showing a step of implanting charged particle beams into a template according to a third embodiment, and FIG. 6(b) is a schematic view showing a porous layer formed in the template.

(Template Manufacturing Method)

First, the template 1, formed with the plurality of convex sections 131 and concave sections 132 on the principal surface 11 side, is prepared.

Next, as shown in FIG. 6(a), the charged particle beams 3 are isotropically implanted into the template 1 by plasma-doping. This plasma-doming is, for example, performed with accelerated energy of such a degree that the charged particle beams 3 do not penetrate the template 1. By this plasma doping, for example, the degassing channels 16 are formed on the sides 132b of the concave sections 132 as well as on the bottoms 132a of the concave sections 132. In addition, although the charged particle beams 3 are implanted into the template 1 from random directions by plasma doping, since a mount for supporting the template 1, which is not shown, is present on the back surface 12 of the template 1, the charged particle beams 3 shall not be implanted into the back surface 12.

Figure 6:
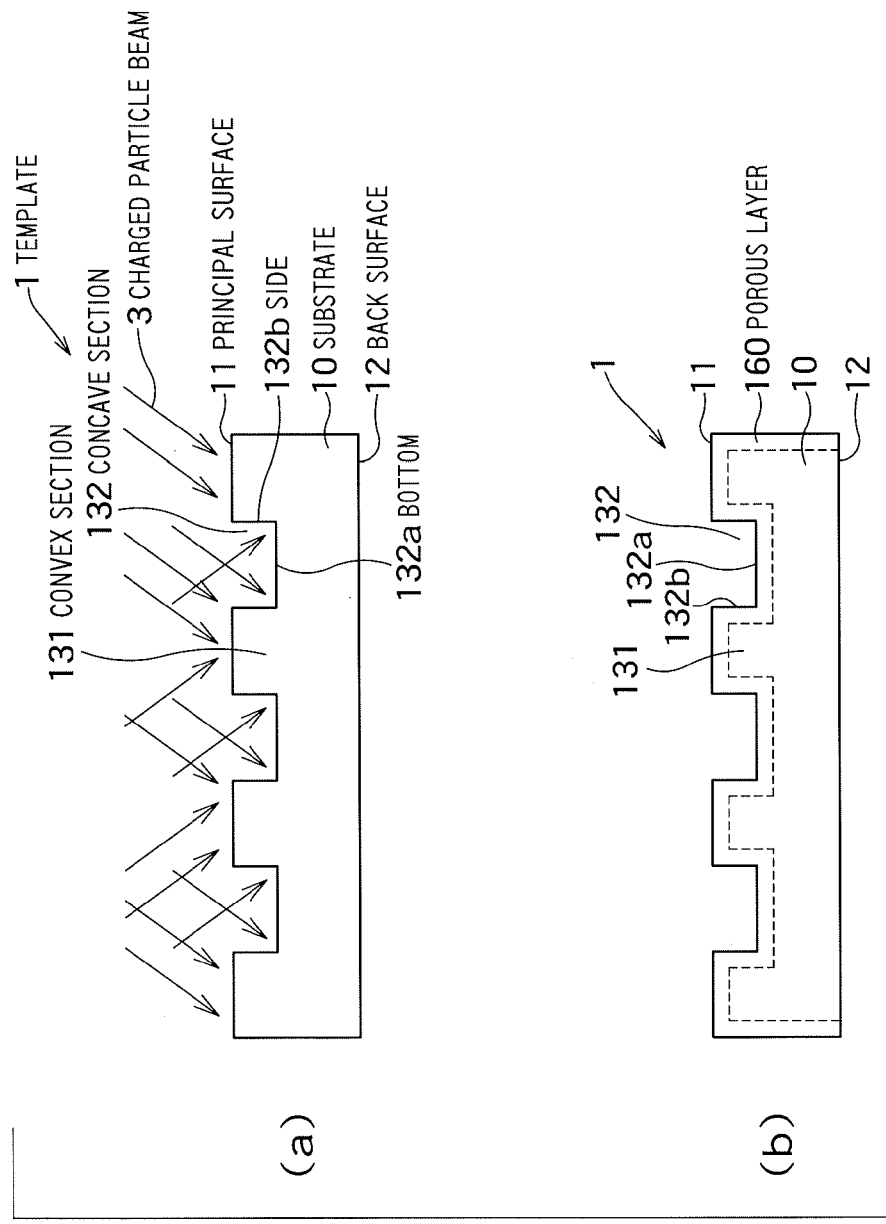
FIG. 6(a) is a schematic view showing a step of implanting charged particle beams into a template according to a third embodiment.
FIG. 6(b) is a schematic view showing a porous layer formed in the template.

In the template 1, for example, as shown in FIG. 6(*b*), a porous layer 160 is formed chiefly on the principal surface 11 side by plasma doping, to obtain the template 1. This porous layer 160 is made up of the degassing channels 16 with a three-dimensional mesh structure formed from the principal surface 11 of the template 1 toward the inside thereof. At the time of imprint processing, the He gas 6 is absorbed into the degassing channel 16 of the porous layer 160, and the concave section 132 is filled with the resist member 5 without a space.

Effect of Third Embodiment

According to the third embodiment, with the porous layer 160 being formed in the template 1, manufacturing cost is reduced as compared with the case of forming the degassing channels as the through holes using high accelerated energy.

Effects of Embodiments

According to the embodiments described above, it is possible to reduce the defect of the transfer pattern. Further, according to the embodiments described above, adjusting the kind of the charged particle beam 3, the accelerated energy and the like can control the number, the shape and the like of the degassing channels 16 in accordance with the kind of the inactive gas used in the imprint processing.

It is to be noted that in the template 1, for example, the degassing channels 16 may be formed before formation of the pattern 130. Further, the implantation of the charged particle beams 3 is performed with changes in the kind of the charged particle beam 3, the implanted amount of the charged particle beams 3, the accelerated energy, the angle of implantation, and the like, in accordance with the gas desired to be transmitted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method for manufacturing a template for use in an imprint processing in which a pattern having irregularities is formed on a principal surface, and the pattern is brought into contact with a resist member formed on a substrate to be processed, to transfer the pattern to the resist member, the method comprising:
   forming a mask on the principle surface of the template;
   etching the template by using the mask to form the pattern on the principle surface;
   forming degassing channels on bottoms of concave portions of the pattern by implanting charged particles into the bottoms of concave portions of the pattern; and
   removing the mask after forming the degassing channels,
   wherein the degassing channels are formed only on the bottoms of concave portions of the pattern, and diamond-like carbon is used as the template.

2. The template manufacturing method according to claim 1, wherein the charged particle is made up of at least one of $e^-$, H, He, Li, Be, B, C, N, O, F, Ne, Na, Mg, Al, Si, P, S, Cl, Ar, K, Ca, Ti, Cr, Fe, Co, Ni, Cu, Zn, Ga, Ge, As, Br, Kr, Mo, I and Xe.

3. The template manufacturing method according to claim 1, wherein the charged particle is made up of an inactive gas.

4. The template manufacturing method according to claim 1, wherein the charged particle is a particle made up of a halogen-based element.

5. The template manufacturing method according to claim 1, wherein the charged particles are implanted from a direction of a normal line of the principal surface.

6. The template manufacturing method according to claim 1, wherein the implanted charged particles penetrate entirely though the thickness of the template so as to form through holes as the degassing channels.

7. The template manufacturing method according to claim 1, wherein the implanted charged particles penetrate only the surface of the template so as to form non-through holes as the degassing channels.

8. The template manufacturing method according to claim 1, wherein the charged particles are implanted from a back surface of the template, as the opposite side to the principal surface.

9. The template manufacturing method according to claim 1, wherein the implantation of the charged particles is performed a plurality of number of times.

* * * * *